United States Patent
Zeller et al.

(10) Patent No.: US 11,650,280 B2
(45) Date of Patent: May 16, 2023

(54) CORRECTION INFLUENCES ON MAGNETIC RESONANCE IMAGING OF AN EXAMINATION OBJECT CAUSED BY FLUCTUATIONS IN A BASIC MAGNETIC FIELD

(71) Applicant: Siemens Healthcare GmbH, Erlangen (DE)

(72) Inventors: Mario Zeller, Erlangen (DE); Adam Kettinger, Bayern (DE)

(73) Assignee: Siemens Healthcare GmbH, Erlangen (DE)

(*) Notice: Subject to any disclaimer, the term of this patent is extended or adjusted under 35 U.S.C. 154(b) by 0 days.

(21) Appl. No.: 17/394,611

(22) Filed: Aug. 5, 2021

(65) Prior Publication Data

US 2022/0043091 A1 Feb. 10, 2022

(30) Foreign Application Priority Data

Aug. 5, 2020 (DE) .................. 102020209911.1

(51) Int. Cl.
*G01V 3/00* (2006.01)
*G01R 33/565* (2006.01)
(Continued)

(52) U.S. Cl.
CPC ..... *G01R 33/56563* (2013.01); *G01R 33/543* (2013.01); *G01R 33/5608* (2013.01); *G01R 33/56545* (2013.01)

(58) Field of Classification Search
CPC .............. G01R 33/3415; G01R 33/543; G01R 33/5659; G01R 33/36; A61B 5/055
(Continued)

(56) References Cited

U.S. PATENT DOCUMENTS 9,536,286 B2 1/2017 Cowan et al.
10,052,026 B1 * 8/2018 Tran ................. A61B 5/165
(Continued)

FOREIGN PATENT DOCUMENTS

AU 2010306700 A1 * 5/2012 ............. A61B 5/055
CN 1849094 A * 10/2006 ........... A61B 5/4509
(Continued)

OTHER PUBLICATIONS

Brownlee, Jason; "Time Series Prediction with LSTM Recurrent Neural Networks in Python with Keras"; Machine Learning Mastery; Deep Learning for Time Series; 2016; URL:https://machinlearn ingmastery.com/time-series-prediction-lstm-recurrent-neural-networks-python-keras/.
(Continued)

*Primary Examiner* — Walter L Lindsay, Jr.
*Assistant Examiner* — Frederick Wenderoth
(74) *Attorney, Agent, or Firm* — Banner & Witcoff Ltd.

(57) ABSTRACT

In a method for correcting influences on magnetic resonance imaging of an examination object caused by fluctuations in a basic magnetic field, an MR data set is generated for two or more measurement periods, and a regression analysis is performed. Each of the MR data sets may contain at least one two-dimensional individual data set. The regression analysis may determine at least one phase correction value for a measurement period to be corrected. Two or more different individual data sets may be taken into account in the analysis. An MR image may generated based on the MR data sets and the at least one phase correction value.

16 Claims, 4 Drawing Sheets

Figure 1:
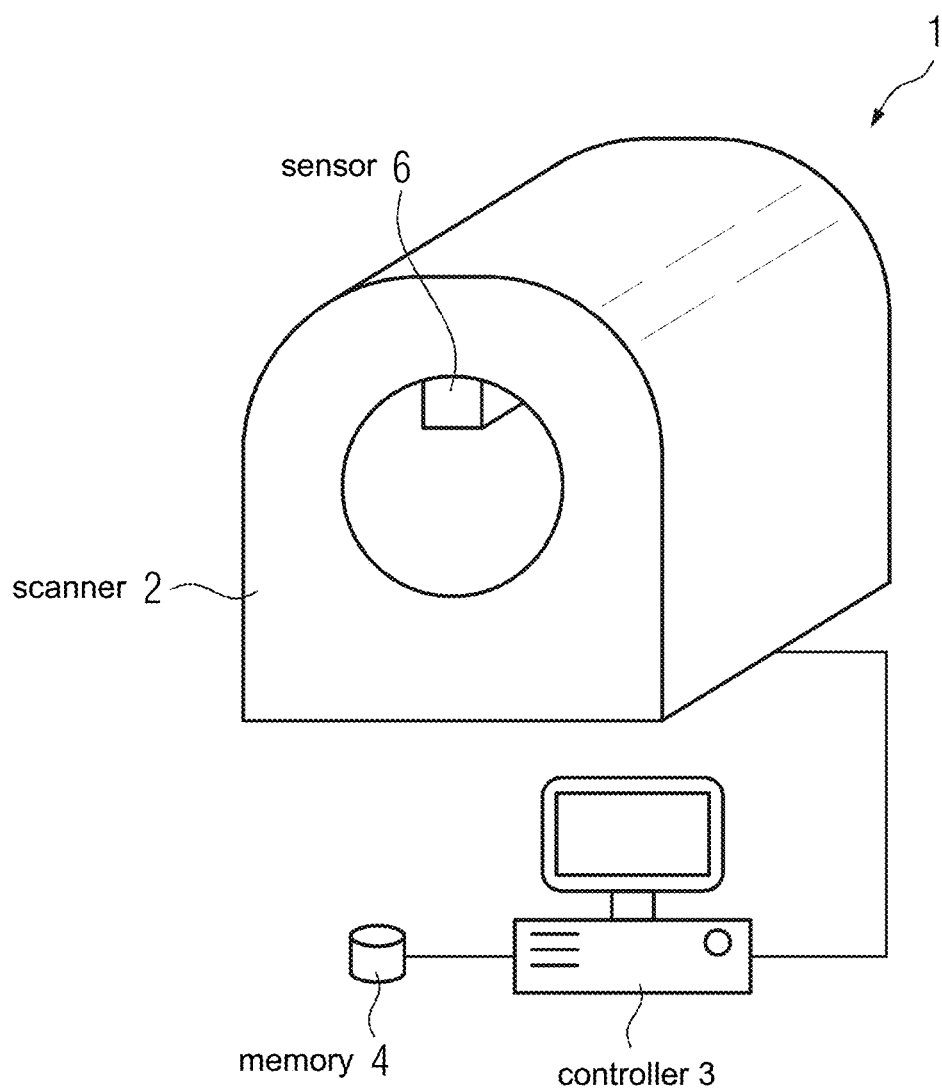

(51) Int. Cl.
*G01R 33/56* (2006.01)
*G01R 33/54* (2006.01)

(58) Field of Classification Search
USPC .......................................................... 324/309
See application file for complete search history.

(56) References Cited

U.S. PATENT DOCUMENTS

| 2012/0249138 | A1 | 10/2012 | Pfeuffer |
| 2016/0081588 | A1 | 3/2016 | Zeller |

FOREIGN PATENT DOCUMENTS

| CN | 101509964 A | * | 8/2009 | |
| CN | 205665697 U | * | 10/2016 | |
| CN | 108968996 A | * | 12/2018 | ........... A61B 5/0064 |
| DE | 102011006230 A1 | | 10/2012 | |
| DE | 102014218901 B4 | | 2/2017 | |
| WO | WO-9216852 A1 | * | 10/1992 | ......... G01R 33/3875 |
| WO | WO-2017197028 A1 | * | 11/2017 | ......... G01N 33/6893 |

OTHER PUBLICATIONS

Hidalgo, Bertha, et. al.; "Multivariate or multivariable regression?"; American journal of public health; 2013; Jg. 103; No. 1; pp. 39-40; DOI: 10.2105/AJPH.2012.300897.
X. Shi et al: "Convolutional LSTM network: a machine learning approach for precipitation nowcasting", arXiv:1506.04214v2, Sep. 19, 2015 (Sep. 19, 2015), XP055368436; 2015.
Wilm, Bertram J. et al. "Diffusion MRI with Concurrent Magnetic Field Monitoring", 2015, Magnetic Resonance in Medicine, vol. 74, pp. 925-933.
Pfeuffer, Josef et al.: "Correction of hysiologically Induced Global Off-Resonance Effects in Dynamic Echo-Planar and Spiral Functional Imaging", Magnetic Resonance in Medicine 47:344-353 (2002), DOI: 10.2002/mrm.10065.
Van De Moortele Pierre-Francois, et al.: "Respiration-Induced B0 Fluctuations and Their Spatial Distribution in the Human Brain at 7 Tesla", in: Magnetic Resonance in Medicine, 2002, vol. 47, pp. 888-895.
German Action dated May 11, 2021, Application No. 10 2020 209 911.1.

* cited by examiner

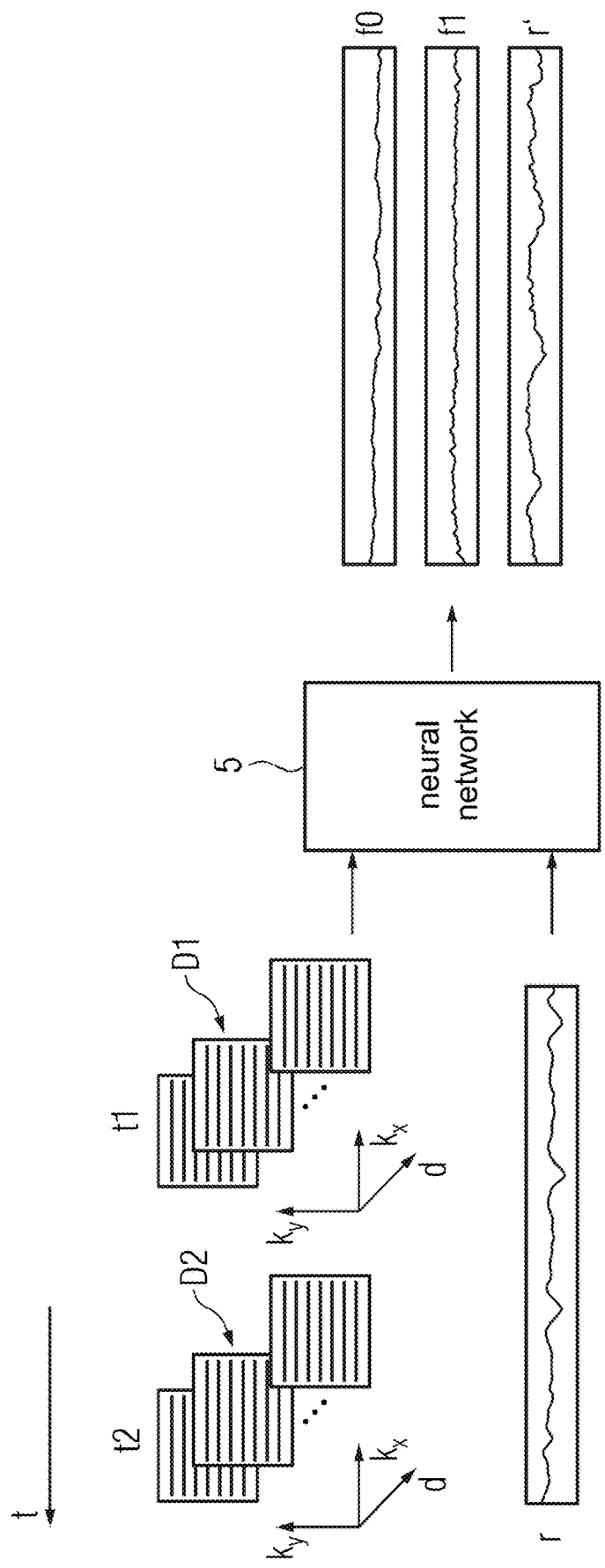

CORRECTION INFLUENCES ON MAGNETIC RESONANCE IMAGING OF AN EXAMINATION OBJECT CAUSED BY FLUCTUATIONS IN A BASIC MAGNETIC FIELD

CROSS REFERENCE TO RELATED APPLICATIONS

This patent application claims priority to German Patent Application No. 10 2020 209 911.1, filed Aug. 5, 2020, which is incorporated herein by reference in its entirety.

BACKGROUND

Field

The present disclosure relates to a method for correcting influences on magnetic resonance (MR) imaging (MRI) of an examination object caused by fluctuations in a basic magnetic field, wherein an MR data set is generated in each case for two or more measurement periods by means of an MR device, wherein each of the MR data sets contains at least one two-dimensional individual data set. The disclosure furthermore relates to a corresponding system for magnetic resonance imaging and a computer program product.

Related Art

In various magnetic resonance imaging techniques, in particular when using echo-planar imaging methods, the magnetic susceptibility of the examination object, for example the tissue to be examined, can change due to the respiratory movements during the MR recording. These changes in susceptibility can lead to fluctuations in the basic magnetic field which in turn result in the image phase changing as a function of time. Other phenomena, such as, for example, heating of gradient coils, can also lead to such changes to the image phase. The changes in the image phase can in turn lead to artifacts in the resulting MR images. For example, a linear change in the image phase over time can lead to a shift in the image space.

The publication by B. J. Wilm et al. "Diffusion MRI with concurrent magnetic field monitoring", Magnetic Resonance in Medicine, 74, 925-833, 2015 describes how the basic magnetic field including fluctuations can be measured by means of magnetic field probes and how corresponding phase correction values can be determined directly from the basic magnetic field measured in this way. However, the exact measurement of the basic magnetic field is complex and time-consuming and therefore unsuitable for clinical or productive use.

DE 10 2014 218 901 B4 describes a method for correcting respiratory influences on recordings of an examination object by means of a magnetic resonance device. For this purpose, an external respiratory signal, an internal respiratory signal and a correlation signal are determined. Then, a reliability range of the correlation signal within the slice positions used in the determination of the internal respiratory signals used is determined. A fit function of the correlation signal is determined in the reliability range and the recordings are corrected based on the fit function.

However, such a method has the disadvantage that the respiratory movement has to be determined with a high degree of accuracy and other effects leading to fluctuations in the basic magnetic field cannot be taken into account. This results in limited accuracy of the correction.

DE 10 2011 006 230 A1 discloses a method for correcting phase information in MR images. Herein, the k-space is sampled by means of an echo-planar method, and a navigator signal that detects an unintentional change to the basic magnetic field is recorded. The phase information is then corrected taking account of the navigator signal.

Since this method is prone to noise and phase errors, the phase information has to be calculated individually for each slice and then averaged. This only enables longer term drifts in phase and effects due to respiration to be taken into account with relatively little accuracy. Moreover, the recording of the navigator signal requires additional time so that the minimum achievable echo time is increased.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

FIG. 1 a system for magnetic resonance imaging according to an exemplary embodiment.

Figure 2B:
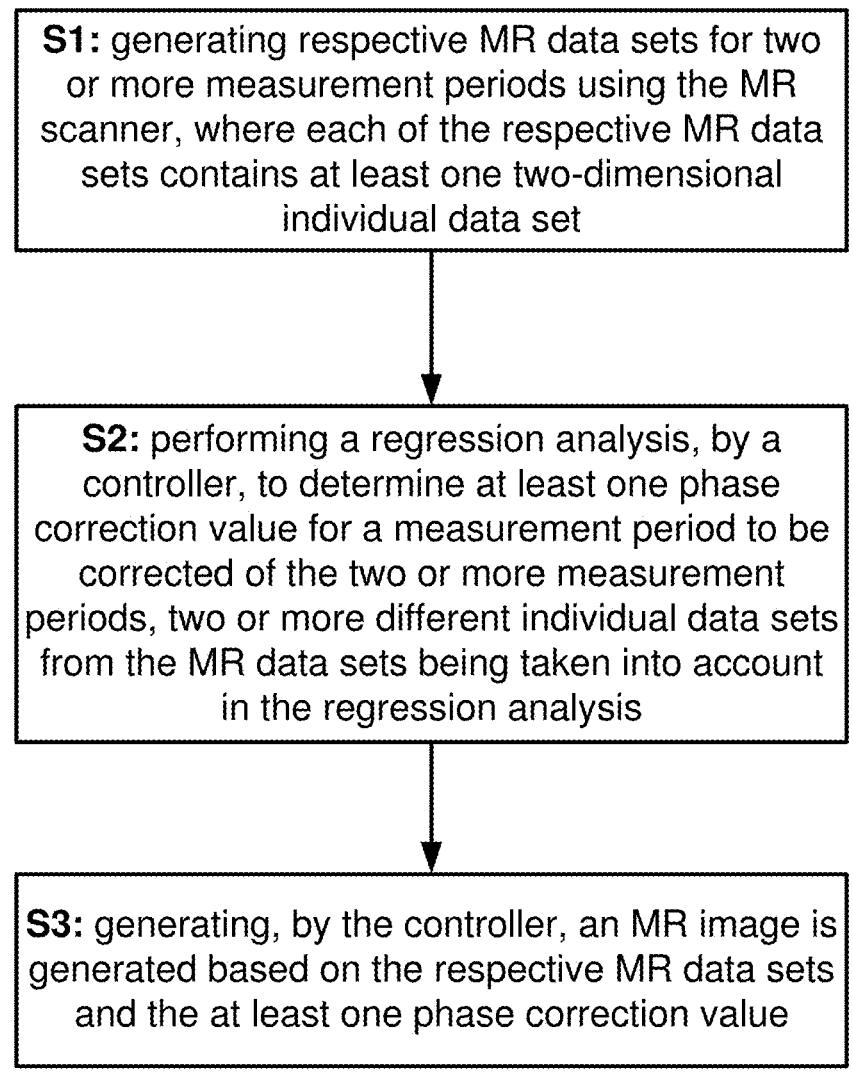

FIGS. 2A-2B flowcharts of a method according to an exemplary embodiment.

Figure 3:
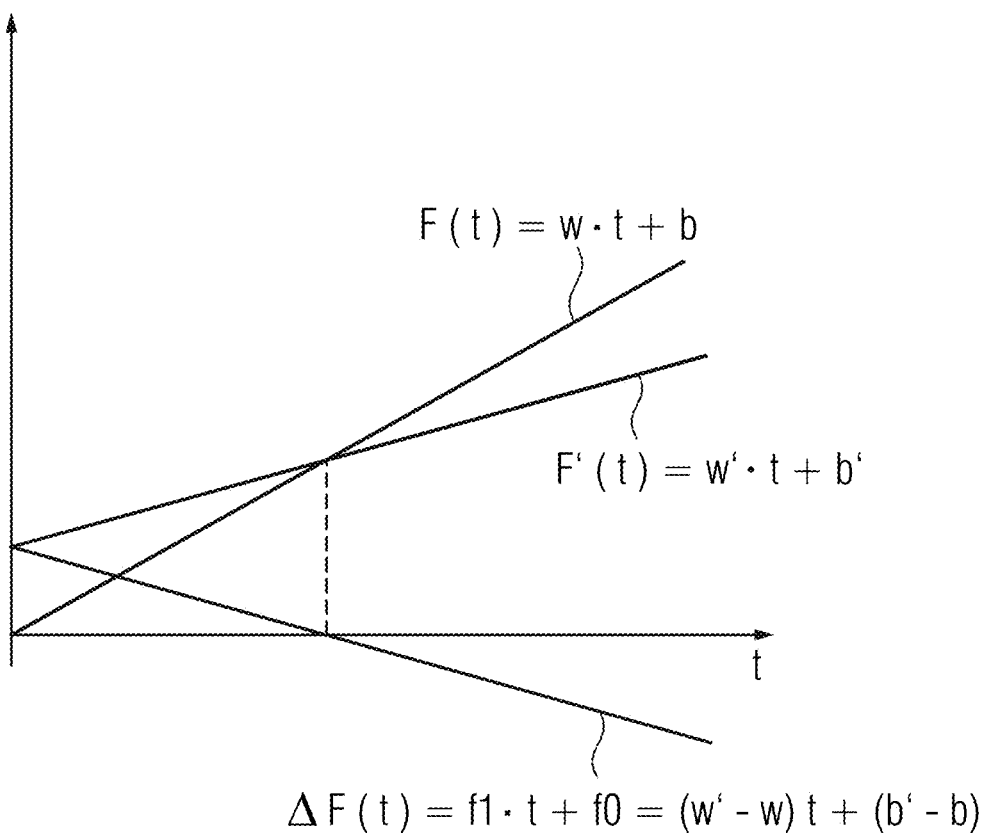

FIG. 3 a plot of phase responses during different measurement periods and a deviation of the phase responses from one another, according to exemplary embodiments.

The exemplary embodiments of the present disclosure will be described with reference to the accompanying drawings. Elements, features and components that are identical, functionally identical and have the same effect are—insofar as is not stated otherwise—respectively provided with the same reference character.

DETAILED DESCRIPTION

In the following description, numerous specific details are set forth in order to provide a thorough understanding of the embodiments of the present disclosure. However, it will be apparent to those skilled in the art that the embodiments, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring embodiments of the disclosure. The connections shown in the figures between functional units or other elements can also be implemented as indirect connections, wherein a connection can be wireless or wired. Functional units can be implemented as hardware, software or a combination of hardware and software.

An object of the present disclosure is to provide a system and method for correcting influences on magnetic resonance imaging caused by fluctuations in a basic magnetic field by means of which the accuracy of the correction is increased. No measurement of the fluctuations is required.

Embodiments include performing a regression analysis for a measurement period to be corrected to determine at least one phase correction value, wherein two or more different two-dimensional individual data sets are taken into account.

The improved concept discloses a method for correcting, or at least partially correcting, influences on magnetic resonance imaging of an examination object caused by fluctuations in a basic magnetic field. Herein, an MR data set is generated in each case for two or more measurement periods by means of an MR device, wherein each of the MR data sets contains at least one two-dimensional individual data set. A regression analysis is performed by means of a controller in order to determine at least one phase correction value for a measurement period to be corrected of the two or more measurement periods. Herein, two or more different individual data sets from the two-dimensional individual data sets from the MR data sets from the two or more measurement periods are taken into account in the regression analysis in order to determine the at least one phase correction value for the measurement period to be corrected. The controller or the MR device generates an MR image based on the MR data sets and the at least one phase correction value.

Here and in the following, MR is used as an abbreviation for magnetic resonance.

Here and in the following, the basic magnetic field can be understood to be an approximately homogeneous magnetic field, frequently also referred to as Bo, in which the examination object is placed in order to generate the spin polarization underlying the nuclear magnetic resonance. Herein, fluctuations in the basic magnetic field can be understood as time-dependent, and possibly location-dependent, changes to the field strength of the basic magnetic field. These can be caused by movements of the examination object, for example respiratory movements, of the material or tissue structure of the examination object or also by the MR device itself, for example due to heating of gradient coils or other components of the MR device.

The influences caused by the fluctuations in the basic magnetic field can be understood to be errors or artifacts in the MR images which are based on the fact that the absence of fluctuations is erroneously assumed during the generation of the MR images, in particular because it is assumed that there is a temporally constant homogeneous magnetic field for the required calculation steps.

The individual data sets can in particular be understood to be MR data in k-space or momentum space. Herein, an individual data set in particular represents the sampling of a predetermined k-space area for a given slice (layer) of the examination object by the MR device. Furthermore, a corresponding receive channel of the MR device is specified for each of the individual data sets. Herein, a receive channel corresponds to a specific receive coil or a defined part of a receive coil of the MR device for recording the corresponding MR signals. Therefore, an individual data set contains MR data obtained by means of a receive channel for a specific slice. In alternative embodiments, instead of being present in k-space, the MR data of the individual data sets can be present in a hybrid momentum-position space in which, for example, one dimension corresponds to a k-space dimension and one dimension to a position space dimension. Each of the measurement periods, which can in particular also be referred to as frames, can therefore include individual data sets for one or more slices and/or one or more receive channels.

The reference to the measurement period to be corrected as such can in particular be understood to mean that the MR data set of the measurement period to be corrected corresponds to an MR data set to be corrected, i.e. for example that it includes an individual data set to be corrected. The at least one phase correction value for the measurement period to be corrected can correspond to at least one phase correction value for the individual data set to be corrected. To generate the MR image, the controller can, for example, correct the individual data set to be corrected in dependence on the at least one phase correction value and the MR image can be generated in dependence on the corrected individual data set.

In different embodiments, the method steps explained with regard to the measurement period to be corrected or the individual data set to be corrected can be correspondingly transferred to further or all measurement periods of the two or more measurement periods or to further or all individual data sets from the MR data sets.

The fact that two or more different individual data sets from the MR data sets are taken into account in the regression analysis can in particular be understood to mean that the at least one phase correction value for the measurement period to be corrected is determined in dependence on the two or more different individual data sets. In particular, the at least one phase correction value is not determined exclusively based on the individual data set to be corrected. To take account of the two or more different individual data sets in the regression analysis, it is possible to take account of at least two different individual data sets from the same MR data set, i.e. from the same measurement period, and/or at least two individual data sets from different MR data sets, i.e. from different measurement periods. If different individual data sets from the same MR data set are taken into account, individual data sets for different slices and/or channels or other further parameters, for example, are taken into account.

Within a measurement period, the phase accumulated by the nuclear spins can change, for example due to applied gradients, for example gradients for phase encoding. However, fluctuations in the basic magnetic field result in an additional undesired phase accumulation and a corresponding change in the phase values. As an approximation, it is, for example, possible to assume a temporally linear deviation due to the fluctuations in the basic magnetic field. Therefore, in this approximation, the phase correction value can, for example, include a constant phase offset, i.e. a zero-order phase correction value and/or a linear component, i.e. a first-order phase correction value. The difference in the linear component in different measurement periods can, for example, be interpreted as a frequency difference with respect to the resonance frequency of the excited nuclear spins.

In the context of the regression analysis, which can in particular take the form of a multivariate regression analysis, the phase correction values can therefore, in particular, be treated as regression variables. Therefore, the phase correction values can also be regarded as the result of the regression analysis.

Taking account of the at least one phase correction value when generating the MR image, which can take place retrospectively or prospectively, enables the influences of the fluctuations in the basic magnetic field to be at least partially compensated. In particular, the fluctuations in the basic magnetic field in the form of the at least one phase correction value can be taken into account in the corresponding calculation steps.

This enables errors in the MR data sets or the individual data sets to be compensated so that ultimately artifacts in the resulting MR image can be reduced and the quality of the MR image improved.

Taking account of the two or more different individual data sets in the regression analysis increases the accuracy of the correction in that additional data, for example from other measurement periods or adjacent slices or other receive channels, is taken into account for the determination of the at least one phase correction value for the measurement period to be corrected. This takes account of the fact that differences in the MR data of different individual data sets implicitly encode the change in phase over time. This additional information is extracted by the regression analysis and advantageously used in the generation of the MR image.

As a result, an explicit determination and measurement of the actual causes of the fluctuation in the basic magnetic field, for example the respiratory movement, can be dispensed with, or reduced accuracy thereof can be deemed acceptable.

Therefore, the improved concept is in particular effective without navigator recordings and is not restricted to the cause of the fluctuations in the basic magnetic field. This enables both fluctuations due to movements of the examination object, in particular respiratory movements, and influences due to device-inherent effects, for example heating of gradient coils over time, to be taken into account.

According to at least one embodiment of the method according to the improved concept, the regression analysis is performed as a multivariate regression analysis.

This in particular enables two or more phase correction values to be determined so that the correction of the influences due to the fluctuations in the basic magnetic field can take place more comprehensively and with a higher degree of accuracy.

According to at least one embodiment, the controller applies a recurrent neural network (RNN) in order to perform the regression analysis, in particular the multivariate regression analysis.

Herein, the controller applies the RNN, which can, for example, be stored on a memory unit of the controller or the MR device, to input data that includes the two or more different individual data sets or is based thereon. In particular, the controller can apply the RNN to a time series of two-dimensional individual data sets. Herein, the RNN is in particular suitably trained to infer the at least one phase correction value based on the individual data sets.

RNNs have been proven to be powerful tools for performing in particular multivariate regression analyses of large data sets so that the correction can take place with a high degree of accuracy and reliability.

Various approaches can be used to train the RNN. For example, it is possible to generate training data for this purpose by generating MR training data and measuring the basic magnetic field exactly during this time, i.e. when sampling the corresponding k-space area, by means of magnetic field probes. The phase correction values can be ascertained directly from the exactly measured basic magnetic field, as, for example, explained in the aforementioned publication by B. J. Wilm et al. The RNN can be suitably trained by comparing these measurement-based phase correction values with the phase correction values predicted on the basis of the RNN.

Herein, training data can, for example, be generated for only one slice at a very large number of time points, so that an influence of respiratory movements or the slice position on the training data is eliminated. Alternatively, the training data can be generated based on recordings with high slice thicknesses, as a result of which the corresponding signal-to-noise ratio increases and the training data becomes more reliable.

According to at least one embodiment, a convolutional long short-term memory module is applied for the application of the RNN, i.e. the RNN includes a convolutional long short-term memory module.

Long short-term memory modules are also referred to as LSTM modules. The use of convolutional LSTMs, such as those described for example in the publication by X. Shi et al. "Convolutional LSTM Network: A Machine Learning Approach for Precipitation Nowcasting", arXiv: 1506.04214v1, 2015, enable them to be used not only for one-dimensional time series, but also, as in the present case, for multi-dimensional input data.

According to at least one embodiment, at least one convolutional layer followed by a non-convolutional LSTM module is applied for the application of the RNN, i.e. the RNN includes at least one convolutional layer and a subsequent non-convolutional LSTM module, i.e. an LSTM module configured to process one-dimensional input data.

The at least one convolutional layer enables the multi-dimensional input data to be converted into one-dimensional input data, which can then be processed using the LSTM module.

According to at least one embodiment, at least one convolutional layer followed by a gated recurrent unit, GRU, is applied for the application of the RNN, i.e. the RNN includes at least one convolutional layer followed by a GRU. The GRU can therefore be considered to be an alternative to the non-convolutional LSTM module.

According to at least one embodiment, during the generation of the MR data sets, a navigator signal which depends on the fluctuation in the basic magnetic field is recorded. The regression analysis is performed in dependence on the navigator signal.

According to at least one embodiment, the two-dimensional individual data sets include two-dimensional k-space data or two-dimensional k-space raw data or two-dimensional hybrid momentum-position space data.

In particular, when an RNN is applied in order to perform the regression analysis, it can extract the relevant features directly from the raw data so that the use of a navigator signal can be dispensed with. This enables the minimum achievable echo time to be reduced.

However, the navigator signal can also be used additionally to said raw data in order to increase the reliability and accuracy of the correction, for example if the navigator signal is also detected for other purposes.

According to at least one embodiment, an echo-planar method is applied for the generation of the MR data sets.

Echo-planar imaging methods are particularly sensitive to changes in image phases so that the improved concept has a particularly advantageous effect here.

According to at least one embodiment, the two or more different individual data sets that are taken into account in the regression analysis include an individual data set from the MR data set generated for the measurement period to be corrected, in particular the individual data set to be corrected.

According to at least one embodiment, the two or more different individual data sets that are taken into account in the regression analysis include at least two different individual data sets from different MR data sets.

In particular the two or more different individual data sets include the individual data set to be corrected and an individual data set belonging to another MR data set. Herein, the different individual data sets from different MR data sets can correspond to the same or different slices and/or receive channels.

Taking account of individual data sets from different MR data sets, i.e. different measurement periods, enables the regression analysis, in particular when it is performed by an RNN, to be used to infer the phase correction values from the temporal response or the temporal change in the individual data sets.

According to at least one embodiment, for the generation of the MR data sets, in each case at least two slices of the examination object are excited and an assigned individual data set is generated from the respective MR data set for each of the at least two slices in each case. The two or more different individual data sets that are taken into account in the regression analysis include at least two different individual data sets from the same MR data set, which are assigned to different slices of the at least two slices.

Herein, the slices can be excited simultaneously or sequentially depending on the form of recording method. In particular, the two or more different individual data sets include the individual data set to be corrected and a further individual data set belonging to the same MR data set.

Taking account of different slices, for example adjacent slices, enables the phase correction values to be determined with a higher degree of reliability or accuracy.

According to at least one embodiment, at least two receive channels of the MR device are used in each case for the generation of the MR data sets and an assigned individual data set from the respective MR data set is generated for each of the at least two receive channels in each case. The two or more different individual data sets that are taken into account in the regression analysis include at least two different individual data sets from the same MR data set, which are assigned to different receive channels of the at least two receive channels.

This can further increase the reliability and accuracy of the determination of the phase correction values. In particular, the two or more different individual data sets include the individual data set to be corrected and a further individual data set belonging to the same MR data set.

According to at least one embodiment, a respiratory movement of the examination object is recorded during the generation of the MR data sets and the regression analysis, in particular the multivariate regression analysis, is performed in dependence on the recorded respiratory movement.

Herein, to record the respiratory movement, in particular a movement curve of the respiratory movement or an amplitude of the respiratory movement is recorded.

For this purpose, the MR device can include an apparatus for recording the respiratory movement. The apparatus can, for example, include one or more cameras in order to determine the movement of the examination object on the basis of the respiratory movement.

Since, as described above, the respiratory movements can make a significant contribution to the fluctuations in the basic magnetic field, taking account of the respiratory movement in the regression analysis achieves higher accuracy in the determination of the phase correction values.

According to at least one embodiment, a result of the regression analysis is used as the basis for determining a future respiratory movement of the examination object.

Herein, the future respiratory movement can be regarded as a further result of the regression analysis or as a further regression variable. The future respiratory movement can, for example, be provided as separate information.

According to at least one embodiment, the at least one phase correction value contains a first phase correction value corresponding to a temporally constant component of a deviation of a phase response from a predetermined reference phase response during the measurement period to be corrected.

In other words, the at least one phase correction value contains a constant phase offset.

According to at least one embodiment, the at least one phase correction value contains a second phase correction value corresponding to a temporally linear component of the deviation of the phase response from the reference phase response during the measurement period to be corrected.

Therefore, the second phase correction value corresponds to the first-order phase correction, i.e. to a frequency offset. Therefore, the second phase correction value corresponds to a particularly relevant correcting quantity since it leads to shifts in the image space of the MR image. These shifts can be compensated by taking account of the second phase correction value.

The improved concept also discloses a system for magnetic resonance imaging of an examination object. The system comprises an MR device configured to generate an MR data set for two or more measurement periods in each case, wherein each of the MR data sets contains at least one two-dimensional individual data set. The system contains a controller configured to perform a regression analysis in order to determine at least one phase correction value for a measurement period to be corrected of the two or more measurement periods and to take account of two or more different individual data sets from the MR data sets in the regression analysis. The controller or the MR device, in particular a further controller of the MR device, is configured to generate an MR image based on the MR data sets and the at least one phase correction value.

Further embodiments of the system according to the improved concept follow directly from the different embodiments of the method according to the improved concept and vice versa. In particular, a system according to the improved concept can be configured or programmed to perform a method according to the improved concept or it performs such a method.

The improved concept also discloses a computer program with instructions, wherein, when the instructions or the computer program are executed by a system according to the improved concept, the instructions cause the system to perform a method according to the improved concept.

The improved concept also discloses a computer-readable storage medium that stores a computer program according to the improved concept.

The computer program and the computer-readable storage medium can in each case be referred to as computer program products with the instructions.

FIG. 1 is a schematic depiction of an exemplary embodiment of a system 1 for magnetic resonance imaging of an examination object. The system 1 comprises an MR device 2 and a controller 3 coupled to the MR device (MR scanner) 2. The controller 3 includes processing circuitry that is configured to perform one or more functions and/or operations of the controller 3, including performing a method for correcting influences on magnetic resonance imaging (including a regression analysis) and/or controlling the MR device 2. The controller may include a memory. The controller 3 may be referred to as a calculator or calculating unit in one or more aspects.

The system 1 also comprises a memory 4 which the controller 3 can access. The memory 4 may store an algorithm for performing a regression analysis, in particular a multivariate regression analysis, is stored, in particular an RNN. The controller 3 is configured to execute the algorithm to perform the regression analysis. In an exemplary embodiment, the memory 4 may be comprised within the controller 3.

The system 1 or MR device 2 may optionally include sensor 6 configured to sense a respiratory movement of the examination object. The sensor 6 may include processing circuitry that is configured to perform one or more functions and/or operations of the sensor 6, including sensing a respiratory movement and generating corresponding sensor data. The sensor 6 may be a camera or other motion sensor. The sensor 6 may include one or more additional sensors that are configured to sense additional information (e.g. audio sensor, etc.).

As depicted schematically in FIGS. 2A-2B, an MR data set D1, D2 is generated (51 in FIG. 2B) by means of the MR device 2 for a plurality of successive measurement periods t1, t2 in each case. Herein, each MR data set D1, D2 includes one or more two-dimensional individual data sets, for example in k-space, wherein different individual data sets from an MR data set D1, D2 correspond to different slices and/or different receive channels of the MR device 2. The different slices and/or receive channels are denoted d in the schematic depiction in FIG. 2A.

The MR data sets D1, D2 are supplied to the RNN 5 by means of the controller 3 in the order in which they are generated as input data. Based on this, the RNN 5 performs a multivariate regression analysis (S2 in FIG. 2B) in order to determine a zero-order phase correction value f0 and a first-order phase correction value f1. Herein, in the regression analysis for a measurement period to be corrected t1, t2 or for a corresponding individual data set to be corrected, the RNN takes account of different individual data sets, for example individual data sets from different MR data sets D1, D2, i.e. different measurement periods t1, t2, and/or different individual data sets from different receive channels and/or slices.

Optionally, a respiratory curve r can be recorded by means of the sensor 6 for detecting respiratory movement while the MR data sets D1, D2 are generated. The respiratory curve r is then also supplied to the RNN as part of the input data. The RNN 5 can then, for example, determine a predicted value r' for the respiratory movement based on the multivariate regression analysis.

An MR image may then generated (S3 in FIG. 2B) based on the MR data sets (D1, D2) and one or more of the phase correction values (f0, f1).

To elucidate the phase correction values f0, f1, FIG. 3 depicts the temporal responses of the image phases F, F' for different measurement periods. Herein, F and F' can be approximately assumed to be linear functions. If one of the phase responses, for example F, is regarded as a reference response, the zero-order phase correction value f0 can be interpreted as the difference b'−b between the y-axis segments b', b. The first-order phase correction value f1 can be interpreted as the difference w'−w between the slopes w', w.

Different architectures can be used for the RNN 5. An exemplary network architecture uses a convolutional LSTM module, i.e. a LSTM module that includes a convolutional step and therefore, in contrast to conventional LSTMs that are only able to process one-dimensional time series input data, is suitable for processing multi-dimensional input data.

For example, one or more 64×64 matrices can be used as input layers and processed with two convolutional LSTM modules resulting in 32 or 16 feature maps. The specific dimensions can of course be adapted to the corresponding requirements.

An exemplary architecture for the RNN 5 can therefore take the following form:

| Layer type | Output format | # Param. |
|---|---|---|
| ConvLSTM2D | (a, b, 64, 64, 32) | 40448 |
| BatchNormalization | (a, b, 64, 64, 32) | 128 |
| ConvLSTM2D | (a, b, 64, 64, 16) | 27712 |
| BatchNormalization | (a, b, 64, 64, 16) | 64 |
| Time_distributed Dense | (a, b, 16) | 1048592 |
| Dense | (a, b, 2) | 34 |

Herein, the order of the layers to be applied is shown from top to bottom. #Param. refers to the number of trainable or trained parameters, for example weights and offset values, of the corresponding layer. "a" corresponds to the number of training data sets used and "b" corresponds to the number of measurement periods taken into account. The last entry in the output format corresponds to the number of feature maps generated. With ConvLSTM2D and BatchNormalization, the entries 64 stand for the number of data points of the two-dimensional input data, i.e., for example, in the kx-direction and ky-direction or in the kx-direction and y-direction.

ConvLSTM2D refers to convolutional LSTM modules, such as those described, for example, in the aforementioned publication by X. Shi et al. BatchNormalization represents normalization layers that normalize the activations of the previous layer in each case, i.e. in particular a transformation that keeps the mean activation close to 0 and the standard activation deviation close to 1. The two dense steps in each case combine each of their input elements with each of the output elements thus resulting in a vector. Herein, the row Time distributed indicates that both dense steps are applied to the corresponding result of the preceding layers for each point in time.

Different receive channels and/or slices can be concatenated if necessary; for example, with 8 channels this results in (a, b, 64×8, 64, 32) or (a, b, 64, 64×8, 32) instead of (a, b, 64, 64, 32). Alternatively, the receive channels and/or slices can be considered to be additional dimensions.

Instead of convolutional LSTMs, it is also possible, for example, to use convolutional layers before a conventional LSTM or before a GRU in order to extract the relevant features.

In advantageous embodiments, no navigator signals are used, instead, as described, the k-space-raw data is used as input data. The RNN can then extract the relevant data directly from the k-space-data. This enables the minimum achievable echo time to be reduced.

Instead of using the entire k-space, it is also possible to use parts of the k-space, for example central lines through the k-space origin, as input data. This can reduce the calculation effort.

If, however, navigator signals are anyway generated for other applications, both the navigator signals and the k-space-raw data can be used as input data.

As described in particular with reference to the figures, the improved concept allows influences of fluctuations in the basic magnetic field to be compensated with a higher degree of accuracy without measuring these fluctuations during the productive or clinical phase. For this purpose, in different embodiments, a plurality of measurement periods, slices, receive channels and/or the respiratory curve are taken into account in the determination of the phase correction values in the context of a regression analysis. This increases the accuracy of the phase correction values, which can also result in increased temporal resolution. For example, phase correction values can also be specified slice-by-slice.

To enable those skilled in the art to better understand the solution of the present disclosure, the technical solution in the embodiments of the present disclosure is described clearly and completely below in conjunction with the drawings in the embodiments of the present disclosure. Obviously, the embodiments described are only some, not all, of the embodiments of the present disclosure. All other embodiments obtained by those skilled in the art on the basis of the embodiments in the present disclosure without any creative effort should fall within the scope of protection of the present disclosure.

It should be noted that the terms "first", "second", etc. in the description, claims and abovementioned drawings of the present disclosure are used to distinguish between similar objects, but not necessarily used to describe a specific order or sequence. It should be understood that data used in this way can be interchanged as appropriate so that the embodiments of the present disclosure described here can be implemented in an order other than those shown or described here. In addition, the terms "comprise" and "have" and any variants thereof are intended to cover non-exclusive inclusion. For example, a process, method, system, product or equipment comprising a series of steps or modules or units is not necessarily limited to those steps or modules or units which are clearly listed, but may comprise other steps or modules or units which are not clearly listed or are intrinsic to such processes, methods, products or equipment.

References in the specification to "one embodiment," "an embodiment," "an exemplary embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The exemplary embodiments described herein are provided for illustrative purposes, and are not limiting. Other exemplary embodiments are possible, and modifications may be made to the exemplary embodiments. Therefore, the specification is not meant to limit the disclosure. Rather, the scope of the disclosure is defined only in accordance with the following claims and their equivalents.

Embodiments may be implemented in hardware (e.g., circuits), firmware, software, or any combination thereof. Embodiments may also be implemented as instructions stored on a machine-readable medium, which may be read and executed by one or more processors. A machine-readable medium may include any mechanism for storing or transmitting information in a form readable by a machine (e.g., a computer). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others.

Further, firmware, software, routines, instructions may be described herein as performing certain actions. However, it should be appreciated that such descriptions are merely for convenience and that such actions in fact results from computing devices, processors, controllers, or other devices executing the firmware, software, routines, instructions, etc. Further, any of the implementation variations may be carried out by a general-purpose computer.

For the purposes of this discussion, the term "processing circuitry" shall be understood to be circuit(s) or processor(s), or a combination thereof. A circuit includes an analog circuit, a digital circuit, data processing circuit, other structural electronic hardware, or a combination thereof. A processor includes a microprocessor, a digital signal processor (DSP), central processor (CPU), application-specific instruction set processor (ASIP), graphics and/or image processor, multi-core processor, or other hardware processor. The processor may be "hard-coded" with instructions to perform corresponding function(s) according to aspects described herein. Alternatively, the processor may access an internal and/or external memory to retrieve instructions stored in the memory, which when executed by the processor, perform the corresponding function(s) associated with the processor, and/or one or more functions and/or operations related to the operation of a component having the processor included therein. In one or more of the exemplary embodiments described herein, the memory is any well-known volatile and/or non-volatile memory, including, for example, read-only memory (ROM), random access memory (RAM), flash memory, a magnetic storage media, an optical disc, erasable programmable read only memory (EPROM), and programmable read only memory (PROM). The memory can be non-removable, removable, or a combination of both.

The invention claimed is:

1. A method for correcting influences on magnetic resonance imaging of an examination object caused by fluctuations in a basic magnetic field, wherein
generating, by a magnetic resonance (MR) scanner, respective MR data sets for two or more measurement periods, wherein each of the respective MR data sets contains at least one two-dimensional (2D) individual data set;
performing a regression analysis, by a controller, to determine at least one phase correction value for a measurement period to be corrected of the two or more measurement periods, two or more different individual data sets from the MR data sets being considered in the regression analysis; and
generating, by the controller, an MR image based on the respective MR data sets and the at least one phase correction value, and providing an electronic signal representing the generated MR image as an output of the controller.

2. A system for magnetic resonance (MR) imaging of an examination object, the system comprising:
a MR scanner configured to generate an MR data set for two or more measurement periods, each of the respective MR data sets containing at least one two-dimensional (2D) individual data set; and
a controller configured to:
perform a regression analysis to determine at least one phase correction value for a measurement period to be corrected of the two or more measurement periods, two or more different individual data sets from the MR data sets being considered in the regression analysis;

generate an MR image based on the MR data sets and the at least one phase correction value; and provide an electronic signal representing the generated MR image as an output of the controller.

3. A system for magnetic resonance (MR) imaging of an examination object, the system comprising:

a memory that stores a computer program; and a processor configured to execute the computer program to:

perform a regression analysis on a MR data set for two or more measurement periods, each of the respective MR data sets containing at least one two-dimensional (2D) individual data set, to determine at least one phase correction value for a measurement period to be corrected of the two or more measurement periods, two or more different individual data sets from the MR data sets being considered in the regression analysis;

generate an MR image based on the MR data sets and the at least one phase correction value; and provide an electronic signal representing the generated MR image as an output of the processor.

4. The method as claimed in claim 1, wherein the regression analysis is performed as a multivariate regression analysis.

5. The method as claimed in claim 1, wherein the controller is configured to apply a recurrent neural network (RNN) to perform the regression analysis.

6. The method as claimed in claim 5, wherein:

a convolutional long short-term memory module is applied for the application of the RNN;

at least one convolutional layer followed by a non-convolutional long short-term memory module is applied for the application of the RNN; and/or at least one convolutional layer followed by a gated recurrent unit (GRU) is applied for the application of the RNN.

7. The method as claimed in claim 1, wherein:

during the generation of the MR data sets, a navigator signal is recorded, the navigator signal depending on the fluctuation in the basic magnetic field; and the regression analysis is performed based on the navigator signal.

8. The method as claimed in claim 1, wherein the two or more different individual data sets that are considered in the regression analysis include an individual data set from the MR data set generated for the measurement period to be corrected.

9. The method as claimed in claim 1, wherein the two or more different individual data sets that are considered in the regression analysis include at least two different individual data sets from different MR data sets.

10. The method as claimed in claim 1, wherein:

the generation of the MR data sets includes exciting at least two slices of the examination object and generating an assigned individual data set for each of the at least two slices in each case; and the two or more different individual data sets that are taken into account considered in the regression analysis include at least two different individual data sets from the same MR data set and which are assigned to different slices of the at least two slices.

11. The method as claimed in claim 1, wherein:

the generation of the MR data sets includes at least two receive channels of the MR device are used and an assigned individual data set is generated for each of the at least two receive channels in each case; and the two or more different individual data sets that are considered in the regression analysis include at least two different individual data sets from the same MR data set and which are assigned to different receive channels of the at least two receive channels.

12. The method as claimed in claim 1, wherein:

a respiratory movement of the examination object is recorded during the generation of the MR data sets; and the regression analysis is performed based on the recorded respiratory movement.

13. The method as claimed in claim 12, further comprising determining a future respiratory movement of the examination object based on a result of the regression analysis.

14. The method as claimed in claim 1, wherein:

the at least one phase correction value includes a first phase correction value corresponding to a temporally constant component of a deviation of a phase response from a predetermined reference phase response during the measurement period to be corrected; and/or the at least one phase correction value contains a second phase correction value corresponding to a temporally linear component of the deviation.

15. A non-transitory computer-readable storage medium with an executable program stored thereon, that when executed, instructs a processor to perform the method of claim 1.

16. The system as claimed in claim 3, further comprising a MR scanner configured to generate the MR data set.

* * * * *